US009946281B1

United States Patent
Huang et al.

(10) Patent No.: US 9,946,281 B1
(45) Date of Patent: Apr. 17, 2018

(54) LIMIT CYCLE OSCILLATION REDUCTION FOR DIGITAL LOW DROPOUT REGULATORS

(71) Applicant: University of Macau, Macau (CN)

(72) Inventors: Mo Huang, Macau (CN); Yan Lu, Macau (CN); Sai-Wang Sin, Macau (CN); Seng-Pan U, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 15/427,059

(22) Filed: Feb. 8, 2017

(51) Int. Cl.
*G05F 1/00* (2006.01)
*G05F 1/565* (2006.01)
*G05F 1/46* (2006.01)
*G11C 19/28* (2006.01)

(52) U.S. Cl.
CPC .............. *G05F 1/565* (2013.01); *G05F 1/468* (2013.01); *G11C 19/28* (2013.01)

(58) Field of Classification Search
CPC . G05F 1/613; G05F 1/59; G05F 1/607; G05F 1/56; G05F 1/565; G05F 1/575
USPC ....... 323/226, 269, 273, 274, 275, 279, 280, 323/281
See application file for complete search history.

(56) References Cited

U.S. PATENT DOCUMENTS

| 9,734,904 B1* | 8/2017 | Cho | ................... G11C 13/0038 |
| 2014/0266103 A1* | 9/2014 | Wang | ...................... G05F 1/462 323/274 |
| 2016/0202714 A1* | 7/2016 | Luria | ........................ G05F 1/56 713/300 |

OTHER PUBLICATIONS

Y. Okuma, et al., "0.5-V input digital LDO with 98.7% current efficiency and 2.7-μA quiescent current in 65nm CMOS," in IEEE Custom Integrated Circuits Cont. (CICC), Sep. 2010, pp. 1-4.
Y.-H. Lee, et al., "A Low Quiescent Current Asynchronous Digital-LDO With PLL-Modulated Fast-DVS Power Management in 40 nm SoC for MIPS Performance Improvement," IEEE J. Solid-State Circuits, vol. 48, No. 4, pp. 1018-1030, Apr. 2013.
Y. Lu, et al., "A fully-integrated low-dropout regulator with full-spectrum power supply rejection," IEEE Trans. Circuits Syst. I: Regular Papers, vol. 62, No. 3, pp. 707-716, Mar. 2015.
W. E. Vander Velde, Multiple-Input Describing Functions and Nonlinear System Design. New York: McGraw-Hill, 1968.
M. Bradley, E. Alarcon, and O. Feely, "Design-oriented analysis of quantization-induced limit cycles in a multiple-sampled digitally controlled buck converter," in IEEE Trans. Circuits Syst. I: Reg. Papers, vol. 61, No. 4, pp. 1192-1205, Apr. 2014.
A. V. Peterchev and S. R. Sanders, "Quantization resolution and limit cycling in digitally controlled PWM converters," in IEEE Trans. on Power Electronics, vol. 18, No. 1, pp. 301-308, Jan. 2003.

(Continued)

*Primary Examiner* — Alex Torres-Rivera
(74) *Attorney, Agent, or Firm* — Eagle IP Limited; Jacqueline C. Lui

(57) ABSTRACT

A method achieves minimum limit cycle oscillation (LCO) amplitude of a digital low dropout regulator (D-LDO) by adding auxiliary unit power transistors in parallel with the main PMOS array with selected unit strength and LCO mode. An improved D-LDO with reduced LCO amplitude includes an auxiliary power transistor array in selected strength driven by an output of a comparator in parallel with a main power transistor array.

19 Claims, 16 Drawing Sheets

(56) References Cited

OTHER PUBLICATIONS

A. P. Dancy, R. Amirtharajah, and A. P. Chandrakasan, "High-efficiency multiple-output DC-DC conversion for low-voltage systems," in IEEE Trans. Very Large Scale Integration (VLSI) Syst., vol. 8, No. 3, pp. 252-263, Jun. 2000.
M. P. Chan and P. K. T. Mok, "Design and Implementation of fully integrated digitally controlled current-mode buck converter," IEEE Trans. Circuits Syst. I: Reg. Papers, vol. 58, No. 8, pp. 1980-1991, Aug. 2011.
S. B. Nasir and A. Raychowdhury, "On limit cycle oscillations in discrete-time digital linear regulators," in IEEE Applied Power Electronics Conf. and Exposition (APEC), Mar. 2015, pp. 371-376.
S. Gangopadhyay, et al., "Modeling and analysis of digital linear dropout regulators with adaptive control for high efficiency under wide dynamic range digital loads," in Design, Automation and Test in Europe Conf. and Exhibition (Date), Mar. 2014, pp. 1-6.
B. C. Kuo, "Forced oscillations and suppression of oscillations in nonlinear sampled-data systems," IEEE Trans. on Automatic Control, vol. 11, No. 2, pp. 290-292, Apr. 1966.
Mo Huang, Yan Lu, Sai-Weng Sin, Seng-Pan U, and Rui P. Martins, "A Fully-Integrated Digital LDO with Coarse-Fine-Tuning and Burst-Mode Operation", in IEEE Trans. Circuits Syst. II: Express Brief, early access.

\* cited by examiner

| $\theta_N$ | $\theta_S$ | $\theta_P$ |
|---|---|---|
| $\frac{\pi}{2M}-\phi$ | $-\frac{\pi}{2}-\frac{\pi}{2M}$ | $-\tan^{-1}\left(\frac{\pi}{M}\frac{\tau}{T_s}\right)-\frac{\pi}{2M}$ |

US 9,946,281 B1

LIMIT CYCLE OSCILLATION REDUCTION FOR DIGITAL LOW DROPOUT REGULATORS

FIELD OF THE INVENTION

The present invention relates to methods and apparatus that reduce a limit cycle oscillation (LCO) amplitude of a digital low dropout regulator (D-LDO).

BACKGROUND

A D-LDO manages to operate at low voltage and scale with process. Acceleration of the transient response of the D-LDO by a high sampling frequency inevitably undermine the steady-state power consumption, while low sampling frequency operations result in a longer charging/discharging on the output capacitor once an inherent ripple exists on the control word. This ripple is known as limit cycle oscillation (LCO) which incites large, unfavorable output voltage variation.

New methods and systems that achieve minimum LCO amplitude of D-LDO will assist in advancing technological needs and solving technological problems.

SUMMARY OF THE INVENTION

Figure 1:
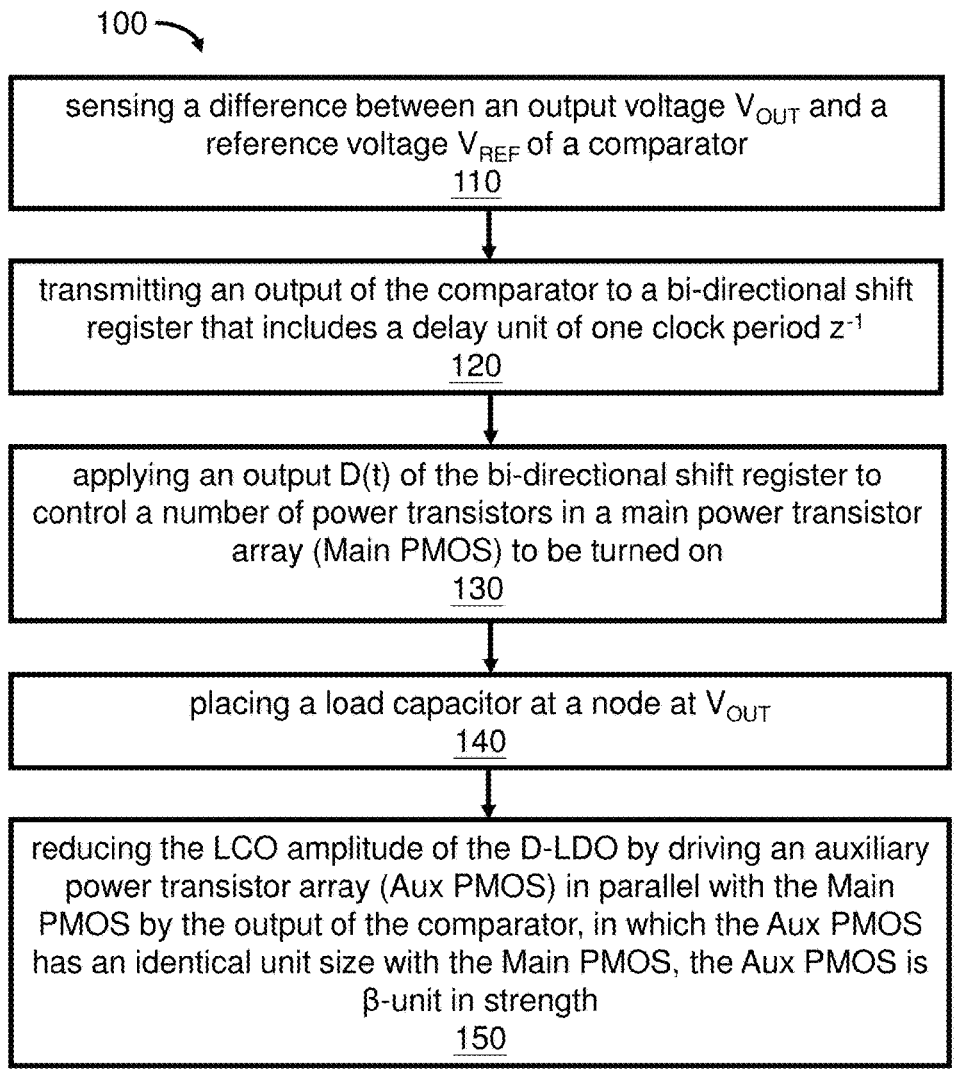
FIG. 1 shows a method that reduces LCO amplitude of a D-LDO in accordance with an example embodiment.

One example embodiment is an improved D-LDO with reduction of LCO amplitude. The improved D-LDO includes a comparator that senses a difference between an output voltage $V_{OUT}$ and a reference voltage $V_{REF}$. An output of the comparator transmits to a serial-in parallel-out bi-directional shift register that includes a delay unit of one clock period $z^{-1}$. The comparator and the serial-in parallel-out bi-directional shift register are both operating at a sampling frequency $F_S$. An output D(t) of the serial-in parallel-out bi-directional shift register controls a number of power transistors in a main power transistor array (Main PMOS) to be turned on. The improved D-LDO further includes a load capacitor at a node at $V_{OUT}$ and a feed-forward path that reduces LCO amplitude of the improved D-LDO. The feed-forward path includes an auxiliary power transistor array (Aux PMOS). The Aux PMOS is driven by the output of the comparator in parallel with the Main PMOS. The Aux PMOS has an identical unit size with the Main PMOS. The Aux PMOS is $\beta$-unit in strength. $\beta$ is selected to achieve minimum LCO mode and LCO amplitude.

Other example embodiments are discussed herein.

DETAILED DESCRIPTION

Example embodiments relate to apparatus and methods that reduce a limit cycle oscillation (LCO) amplitude of a digital low dropout regulator (D-LDO).

LCO is considered to be undesirable as it incites large and unpredicted output voltage variations. For non-sampled control systems, existing or conventional works such as introducing a digitally controlled DC-DC converted, suggesting a criteria on control law and quantization resolution for LCO elimination are flawed in one or more aspects. For example, LCO is reduced with a higher analog-to-digital converter (ADC) resolution which increases circuit complexity.

Sampled control systems, such as a D-LDO, inherently suffer from LCO due to hard quantization at the comparator input. A dead-zone is generally used for LCO reduction by adding to the comparator stage, essentially a one-bit ADC. However, the dead-zone scheme not only increases the circuit complexity, but also prevents the D-LDO from instant output voltage error detection and consequently limits its transient response. In addition, the strong dependence on the design parameters, as well as the multiplicity of the comparator describing function, increase the difficulty of selecting the dead-zone window.

Example embodiments solve the above-stated problems by providing technical solutions in new methods and apparatus that improve or facilitate the reduction of LCO of a D-LDO.

Example embodiments benefit a low-voltage operation and process-scalability of a D-LDO, provide an improved trade-off between current efficiency and transient response speed, and advance technologies utilizing D-LDO.

Example embodiments include a method that minimizes a LCO amplitude of a D-LDO with negligible circuit complexity and design difficulty by adding power transistors in parallel with the main power MOS array as a feed-forward path. The LCO in steady state is reduced by the feed-forward path compensation zero with negligible power and area overheads.

Example embodiments provide technical solutions that reduce LCO by adding two power transistors in parallel with the main power MOS array. The ripple amplitude is effectively reduced for a wide load current range with the LCO mode set to 1.

In one example embodiment, an improved digital low dropout regulator with reduction of limit cycle oscillation amplitude includes a comparator that senses a difference between an output voltage $V_{OUT}$ and a reference voltage $V_{REF}$.

By way of example, the improved digital low dropout regulator includes a bi-directional shift register includes a delay unit of one clock period $z^{-1}$. An output of the comparator transmits to the bi-directional shift register.

By way of example, the improved digital low dropout regulator includes a main power transistor array (Main PMOS). An output D(t) of the bi-directional shift register controls a number of power transistors in the Main PMOS to be turned on.

As an example, the improved digital low dropout regulator includes a load capacitor which is placed at a node at an output voltage $V_{OUT}$.

By way of example, the improved digital low dropout regulator includes a feed-forward path that reduces LCO amplitude. The feed-forward path includes an auxiliary power transistor array (Aux PMOS) which is driven by the output of the comparator in parallel with the Main PMOS. The the Aux PMOS is β-unit in strength.

As an example, the comparator and the bi-directional shift register are both operating at a sampling frequency $F_S$.

As an example, β is selected to achieve minimum LCO mode and LCO amplitude.

FIG. 1 shows a method that reduces a limit cycle oscillation amplitude of a digital low dropout regulator in accordance with an example embodiment.

Block 110 illustrates sensing a difference between an output voltage $V_{OUT}$ and a reference voltage $V_{REF}$ of a comparator.

Consider an example in which a comparator compares two voltages and outputs a digital signal indicating which is larger.

Block 120 illustrates transmitting an output of the comparator to a bi-directional shift register that includes a delay unit of one clock period $z^{-1}$.

For example, the output of the comparator is fed to a bi-directional shift register and the bi-directional shift register including a delay unit. The $z^{-1}$ is used to model the equivalent delay between the comparator and the bi-directional shift register since they are synchronously sampled. The comparator and the bi-directional shift register are both operating at a sampling frequency $F_S$ in one example embodiment.

Block 130 illustrates applying an output D(t) of the bi-directional shift register to control a number of power transistors in a main power transistor array (Main PMOS) to be turned on.

For example, an output of the bi-directional shift register is connected to a number of power transistors in a main power transistor array (Main PMOS) that are active and inactive according to a scanning circuit of the bi-directional shift register. The bi-directional shift register plays a role of an integrator to minimize the loop steady-state error.

Block 140 illustrates placing a load capacitor at a node at $V_{OUT}$.

By way of example, a load capacitor is connected at the output voltage to reduce the output voltage ripple.

Block 150 illustrates reducing the LCO amplitude of the D-LDO by driving an auxiliary power transistor array (Aux PMOS) in parallel with the Main PMOS by the output of the comparator, in which the Aux PMOS has an identical unit size with the Main PMOS, and the Aux PMOS is β-unit in strength.

By way of example, an Aux PMOS bypasses the integrator and adds a zero to the D-LDO loop. β is selected to achieve minimum LCO mode and LCO amplitude.

Figure 2:
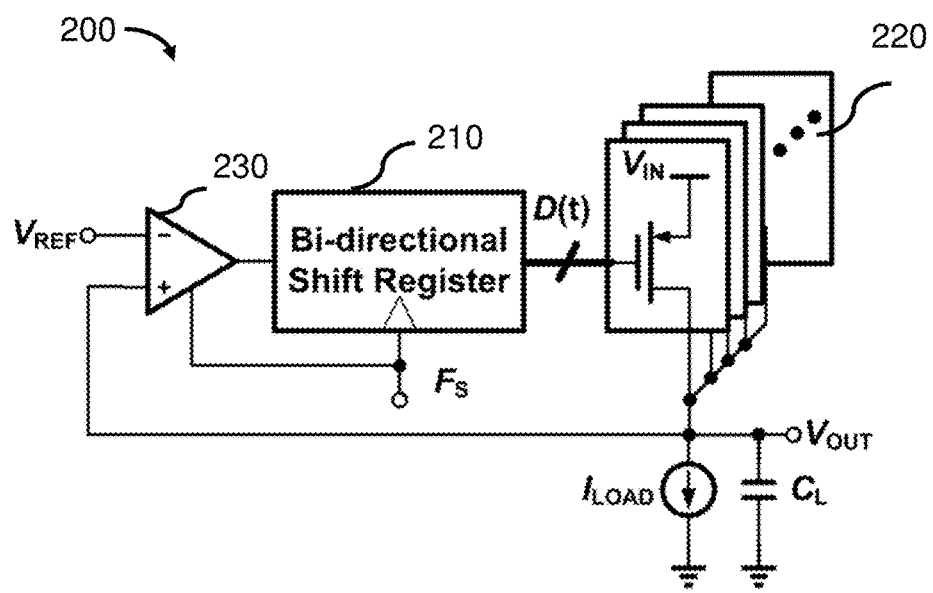
FIG. 2 shows a block diagram of a D-LDO.

FIG. 2 shows a block diagram of a digital low dropout regulator (D-LDO) 200 based on bi-directional shift register 210 with the power transistor array or power MOS array (PMOS) 220. A sampled comparator 230 is used to sense the difference between the output voltage $V_{OUT}$ and the reference voltage $V_{REF}$. To minimize the steady-state error, the sampled comparator's output is fed to an integrator implemented by a serial-in parallel-out bi-directional shift register 210. The output D(t) of the bi-directional shift register 210 is then applied to control the number of power transistors to be turned on. Both the sampled comparator 230 and the bi-directional shift register 210 are operating at the sampling frequency $F_S$. A load capacitor $C_L$ is placed at the $V_{OUT}$ node to reduce the output voltage ripple. The D-LDO in this topology can be scaled with process, be operated at low input voltage, and be fully integrated in a System-on-Chip (SoC) with ease.

Figure 3:
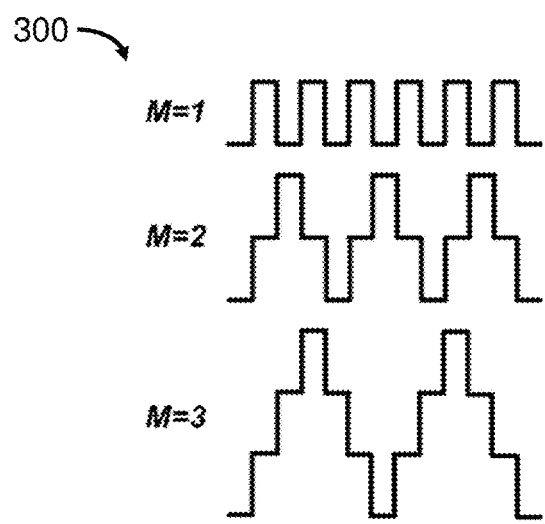
FIG. 3 shows waveforms of the code D(t) of the D-LDO in FIG. 2 with mode-1, 2, 3 LCOs.

The inherent quantization errors with the architecture illustrated in FIG. 2 originates a steady-state limit cycle oscillation (LCO). The period of LCO is 2M times of the sampling period Ts, where M is the mode of LCO. FIG. 3 shows the waveforms of D(t) with M=1, 2, and 3 LCOs.

LCO reduction on D-LDO should be especially focused on two aspects, the light load current and the low $F_S$ conditions, which are desirable for extended load range and improved current efficiency with adaptive clock scheme, respectively. Nevertheless, light load current results in larger load resistance under a fixed $V_{OUT}$, whereas low $F_S$ allows longer charging/discharging time on $C_L$. Both conditions can incite larger LCO amplitudes and thus need special attention. To tackle these issues, an LCO reduction technique is introduced by adding a feed-forward path to the D-LDO loop in one example embodiment.

Figure 4:
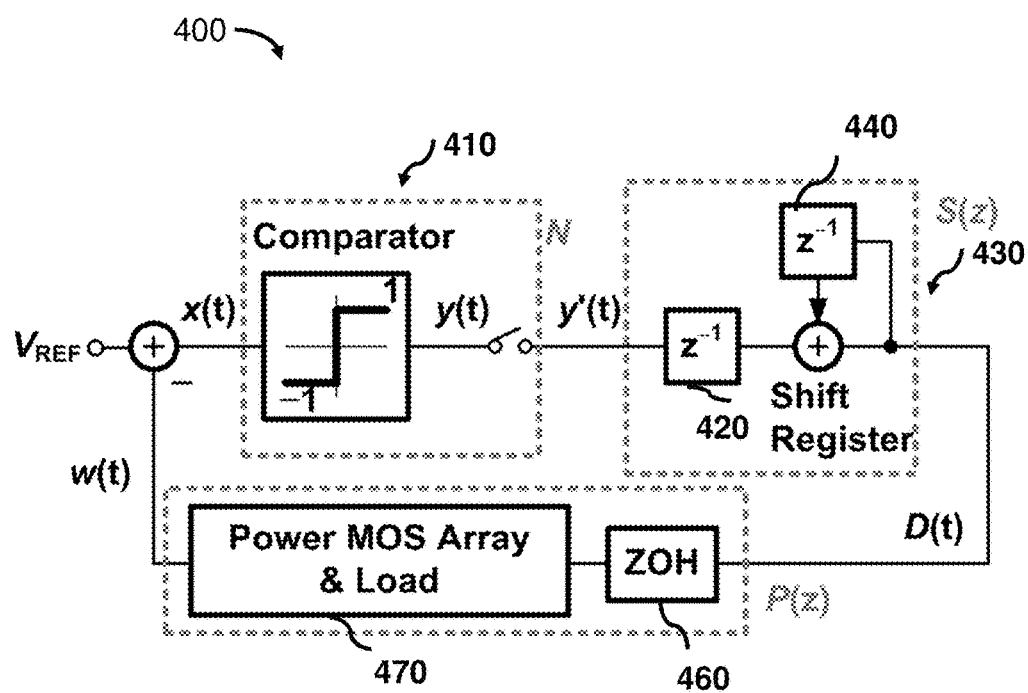
FIG. 4 shows a steady state model of a D-LDO.

FIG. 4 shows a steady-state model of a D-LDO 400, which consists of a sampled comparator N 410, a bi-directional shift register 430 with inherent delay units 420 and 440 of one clock period $z^{-1}$, and a first-order plant driven by a zero-order-hold (ZOH) 460, representing the continuous time plant 470 consisting of the power MOS array and the load. Once sampled, the comparator increases the bi-directional shift register by 1 count if $V_{OUT}$ is larger than $V_{REF}$, and decrease by 1 count if smaller. This confirms the D-LDO as a nonlinear sampled control system, which can be investigated through describing function methods.

The transfer function of the bi-directional shift register including the $z^{-1}$ delay is given as:

$$S(z) = \frac{1}{1-z^{-1}} \cdot z^{-1} = \frac{1}{z-1}. \tag{1}$$

In addition, the z-domain model of the ZOH-based continuous time plant is:

$$P(z) = I_{UNIT} \cdot (R_{LOAD} \| R_{PASS}) \cdot \frac{1 - e^{-\frac{T_S}{\tau}}}{z - e^{-\frac{T_S}{\tau}}} \tag{2}$$

where $I_{UNIT}$ is the unit current provided by a single turned-on power transistor, $R_{LOAD}$ is the load resistance, $R_{PASS}$ is the combined resistance of the power transistors (given by $V_{DS}/I_{LOAD}$, where $V_{DS}$ is the drain-source voltage of the power transistors), and $\tau$ is the time constant of the output pole $(R_{LOAD}\|R_{PASS}) \cdot C_L$. Therefore, the sinusoidal response function of the linear parts of this system is derived as:

$$W(e^{j\omega T_S}) = S(e^{j\omega T_S})P(e^{j\omega T_S}). \tag{3}$$

For the describing function of the comparator 410, the input to the comparator 410 is assumed to be x(t), while y(t) represents the un-sampled comparator output and y'(t) is the sampled output. Without loss of generality, the time origin is assumed to coincide with one of the sampling points. Then x(t) can be expressed as:

$$x(t) = A\sin\left(\frac{\omega_S}{2M}t + \varphi\right), \varphi \in \left(0, \frac{\pi}{M}\right), \tag{4}$$

where A is the LCO amplitude, $\omega_S$ is the angular sampling frequency and $\omega_S/2M$ is thus the angular LCO frequency, and φ is the phase shift. Obviously, for a $\omega_S/2M$ sinusoidal wave sampled by $F_S$, φ should be within 0 and π/M.

The describing function of such sampled comparator, defined as the ratio between the phasor representations of y'(t) and x(t), can be written as:

$$N(A, \varphi) = \frac{2}{MT_S A} \sum_{m=0}^{M-1} \sin\left(\frac{\pi}{2M} + \frac{m\pi}{M}\right) \angle \left(\frac{180°}{2M} - \varphi\right) \tag{5}$$

According to the Nyquist criterion, if a mode-M LCO exists, the following condition should be met:

$$N(A, \varphi) \cdot W(e^{j\omega T_S}) = 1 \angle -180°, \varphi \in \left(0, \frac{\pi}{M}\right), \tag{6}$$

where ω is equal to the angular LCO frequency $\omega_S/2M$. Based on (6), the LCO mode and amplitude can be calculated.

Figure 5A:
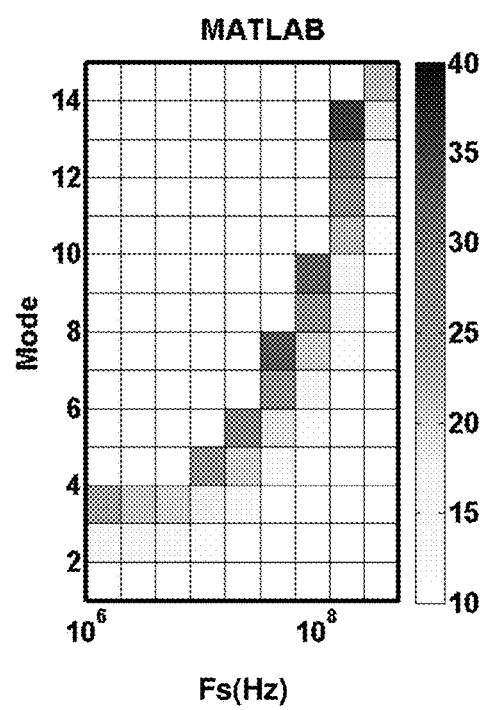
FIG. 5A shows MATLAB calculation on LCO modes and amplitudes versus sampling frequency $F_S$.
Figure 5B:
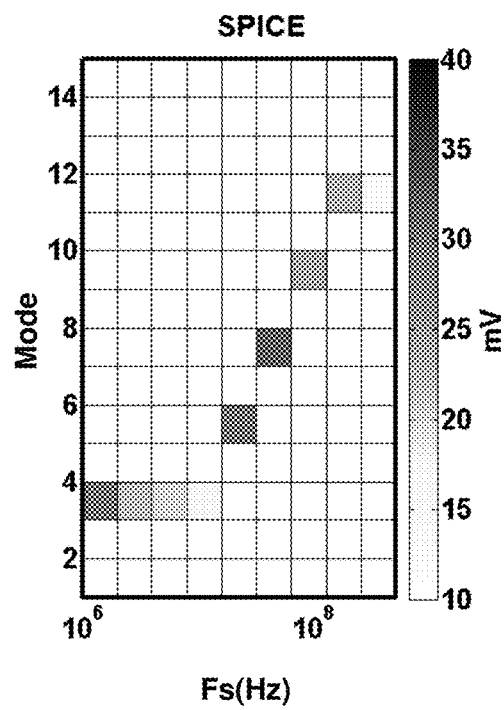
FIG. 5B shows SPICE simulation on LCO modes and amplitudes versus sampling frequency $F_S$.
Figure 6A:
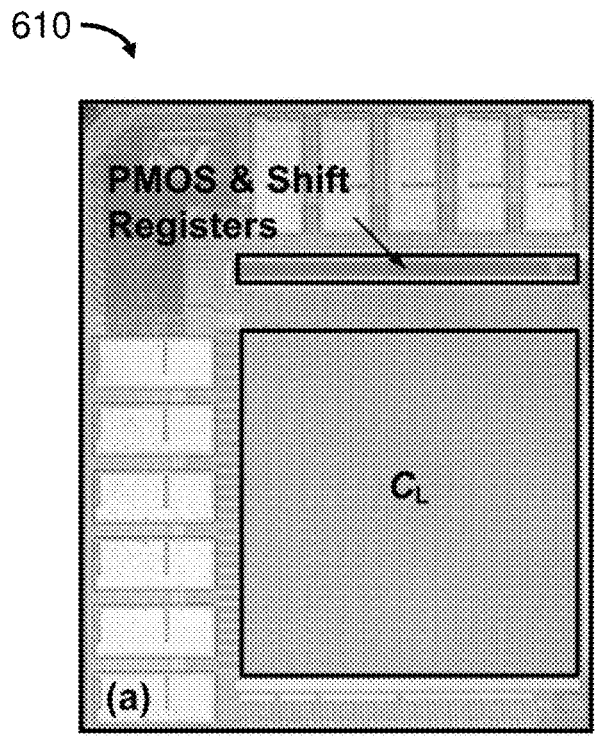
FIG. 6A shows a chip micrograph of a measured D-LDO.
Figure 6B:
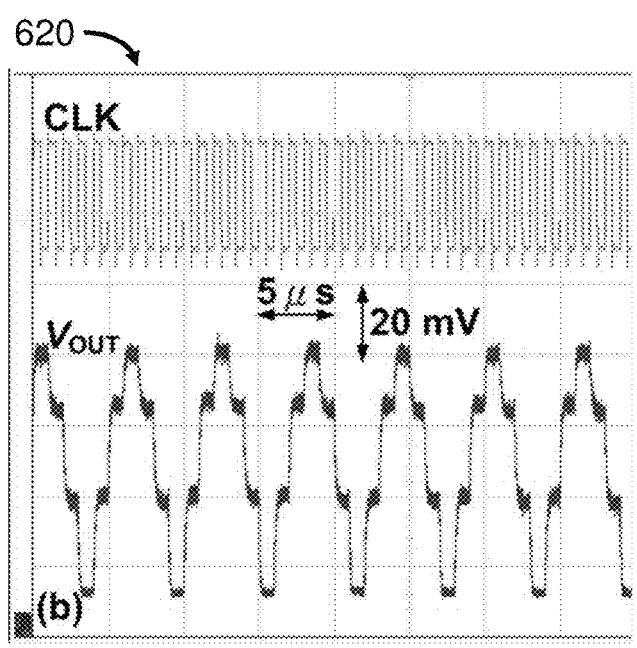
FIG. 6B shows a measured LCO of the D-LDO in FIG. 6A with 1 MHz $F_S$.

A numerical calculation on LCO versus $F_S$ (from 1 to 256 MHz) is performed using MATLAB, with 1 mA load current and a 1 nF $C_L$ for the D-LDO illustrated in FIG. 2. FIG. 5A shows the LCO modes and amplitudes, where the y-axis shows the possible modes of LCO, and the grey scale-bar shows the corresponding amplitudes. More than one possible LCO modes exist for most of the cases, but which mode the system is settled depends on the prior values of the system variables. Meanwhile, to consolidate the theoretical analysis, transistor-level SPICE simulations are performed with identical conditions as a comparison. The simulated results are given in FIG. 5B. The calculated modes successfully cover those obtained from simulation with a wide range of $F_S$, and the amplitudes also match as well. Specifically, the $F_S$=1 MHz case is verified by an on-chip D-LDO of which a microphotograph is illustrated in FIG. 6A, with a mode-3 LCO observed in FIG. 6B. The D-LDO illustrated in FIG. 2 is implemented with a 65 nm standard CMOS process, and consumes 2.5 µA quiescent current at 1 MHz $F_S$, and thus achieves 99.98% current efficiency with a maximum 20 mA load current.

Figure 7A:
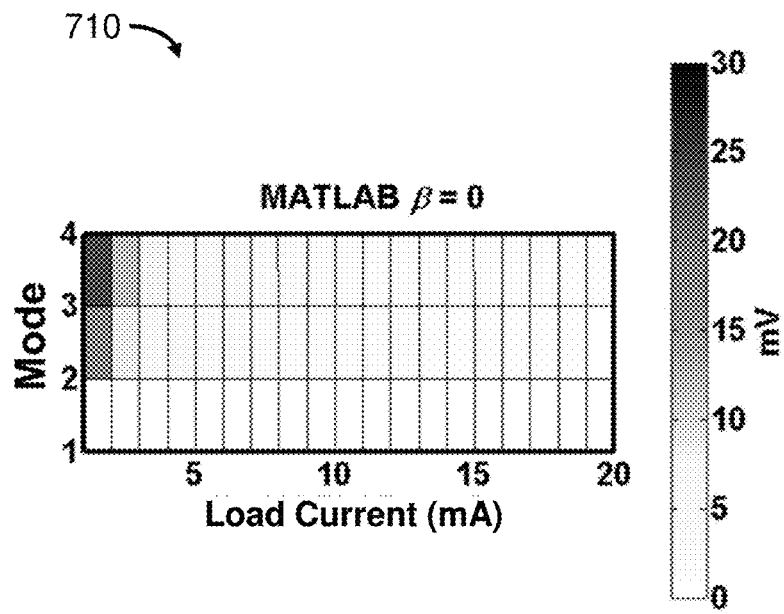
FIG. 7A shows MATLAB calculated results for modes and amplitudes of LCO for a D-LDO configured with 1 MHz $F_S$ and load current from 1 to 20 mA without implementing LCO reduction method of an example embodiment.
Figures 8, 9:
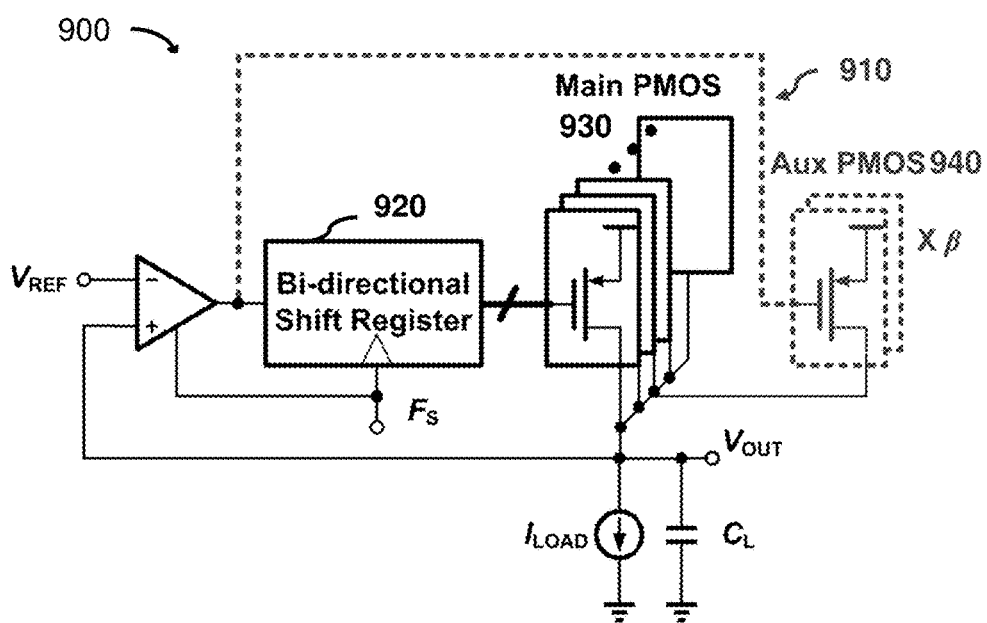
FIG. 8 shows a table that lists the calculated phase shifts caused by the components of a D-LDO.
FIG. 9 shows implementation of an improved D-LDO with LCO reduction in accordance with an example embodiment.

With the same parameters as used for the D-LDO stated above and designed with 1 MHz $F_S$ over a wide load range, the calculated possible modes and amplitudes of LCO with 1 to 20 mA load current are shown in FIG. 7A. It is shown that larger LCO amplitude is incited with lighter load. For example, a 50-mV peak-to-peak ripple is incited with 1-mA load current. If the LCO mode is set to 1, the number of the active power transistors in the steady-state is minimized and thus the amplitude of LCO is reduced. However, the mode-1 LCO cannot be guaranteed with the D-LDO topology as illustrated in FIG. 2. The signal phase shifts are θN, θS and θP, representing the phase shifts caused by components of the D-LDO, i.e. N(A,φ), S(z) and P(z), respectively. FIG. 8 shows table 800 which summarizes these phase shifts. By substituting them into (6), the phase shift for a steady LCO ($\varphi_{LCO}$) can be written as:

$$\varphi_{LCO} = \frac{\pi}{2} - \frac{\pi}{2M} - \tan^{-1}\left(\frac{\pi}{M}\frac{\tau}{T_S}\right), \varphi_{LCO} \in \left(0, \frac{\pi}{M}\right) \tag{7}$$

Since the last term of (7), $-\tan-1[(\pi/M)(\tau/TS)]$, is within $[-\pi/2,0]$, M=1 is not a possible solution of (7). To make M=1, as illustrated as the dashed block in FIG. 9, a feed-forward path 910 including an Aux PMOS 940 is inserted into a D-LDO including a bi-directional shift register 920 and a main PMOS 930 in one example embodiment.

Figure 10:
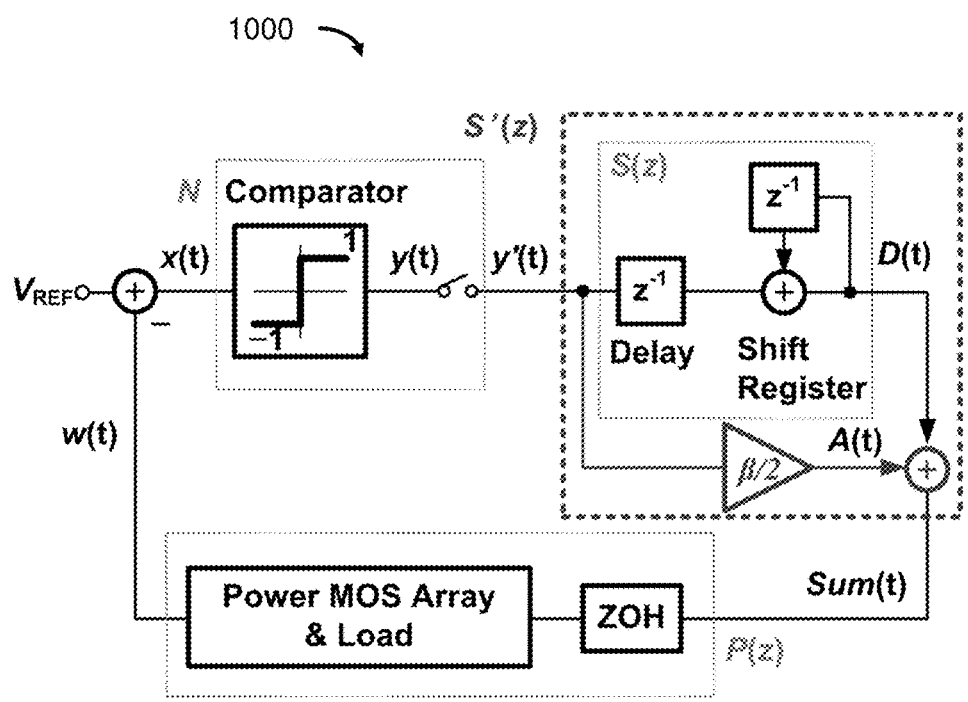
FIG. 10 shows a steady state model of an improved D-LDO with LCO reduction in accordance with an example embodiment.

The steady-state model of an improved D-LDO in one example embodiment is shown in FIG. 10. The sampled comparator output y'(t) is directly used to drive a set of auxiliary power transistors or an auxiliary power transistor array (Aux PMOS) in parallel with an original power MOS array or a main power transistor array (Main PMOS). The Aux PMOS has an identical unit size with the Main PMOS, and the Aux PMOS is β-unit in strength. The control word of Aux PMOS is A(t). With this configuration, both the power consumption and the area overheads are negligible.

In one example embodiment, the summed control word Sum(t), which represents summation of D(t) and A(t), can be expressed as:

$$\text{Sum}(t) = \begin{cases} \beta + D(t), & \text{if } y'(t) = 1 \\ D(t), & \text{if } y'(t) = -1 \end{cases}, \quad (7)$$

or $$\text{Sum}(t) = \frac{\beta}{2} y'(t) + D(t) + \frac{\beta}{2}.$$

A DC value of $\beta/2$, corresponding to the third term of (8), is introduced. If only a small signal is considered, the transfer function of the bi-directional shift register and the $z^{-1}$ delay plus the feed-forward path is given as S'(z):

$$S'(z) = S(z) + \frac{\beta}{2} = \frac{1}{z-1} + \frac{\beta}{2}. \quad (8)$$

The LCO modes and amplitudes can therefore be calculated by replacing S(z) with S'(z) in (7).

Figure 7B:
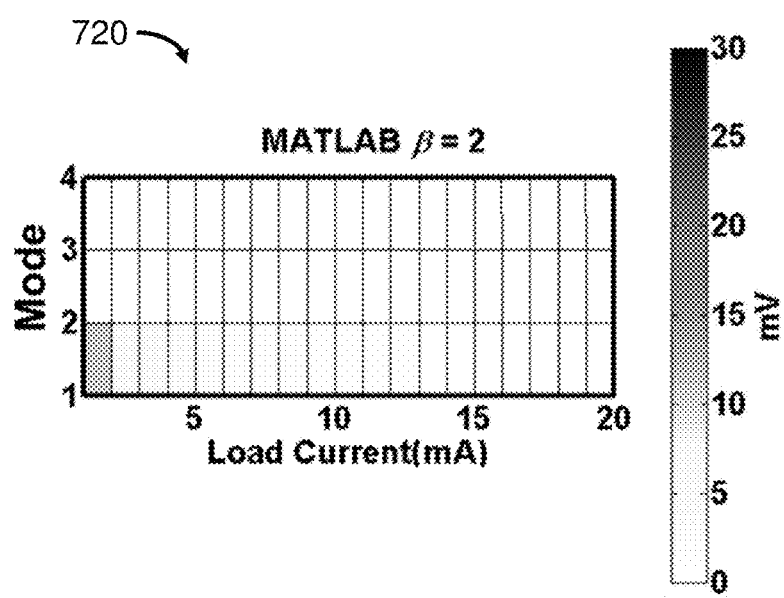
FIG. 7B shows MATLAB calculated results for modes and amplitudes of LCO for an improved D-LDO with 1 MHz $F_S$, load current from 1 to 20 mA and $\beta=2$ in accordance with an example embodiment.

In one example embodiment, $\beta=2$ is selected to achieve minimum LCO mode and amplitude, and the reason is as follows. The calculated LCO modes and amplitudes with $\beta=2$ with 1 MHz $F_S$ and load current from 1 to 20 mA are shown in FIG. 7B. Comparing to the case with $\beta=0$, the example embodiment sets the LCO to mode-1 which in turn effectively reduces the LCO amplitudes. The maximum LCO amplitude is only 11 mV at 1 mA load current.

Figure 11:
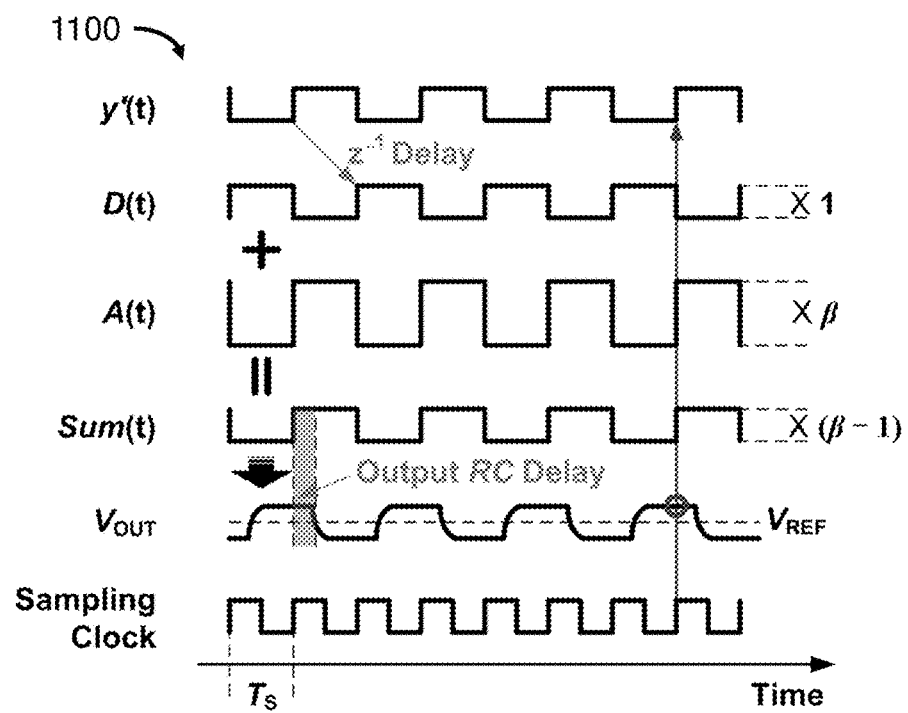
FIG. 11 shows conceptual waveforms of a steady-state mode-1 LCO of an improved D-LDO in accordance with an example embodiment.

How the LCO is set to mode-1 for $\beta=2$ can be intuitively illustrated by FIG. 11 which shows conceptual waveforms of a steady-state mode-1 LCO. In mode-1, the comparator output y'(t) oscillates at a frequency of $F_S/2$ in one example embodiment. With the $z^{-1}$ delay, D(t) is 1-unit in strength, $F_S/2$ in frequency, but 180° lagging from y'(t). Meanwhile, A(t), which is directly driven by y'(t), is in phase with y'(t) but $\beta$-unit in strength. Consequently, Sum(t) is also in phase with y'(t) and ($\beta-1$) unit in strength. Sum(t) is then converted to the output current by the PMOS array, and generates $V_{OUT}$ with LCO at $F_S/2$ with 180° lagging. With an additional phase lag due to the output RC delay, $V_{OUT}$ is sampled and compared with $V_{REF}$, and the comparator output y'(t+$T_S$) coincides with y'(t). With this feedback loop, the steady-state mode-1 LCO is maintained.

Figure 12:
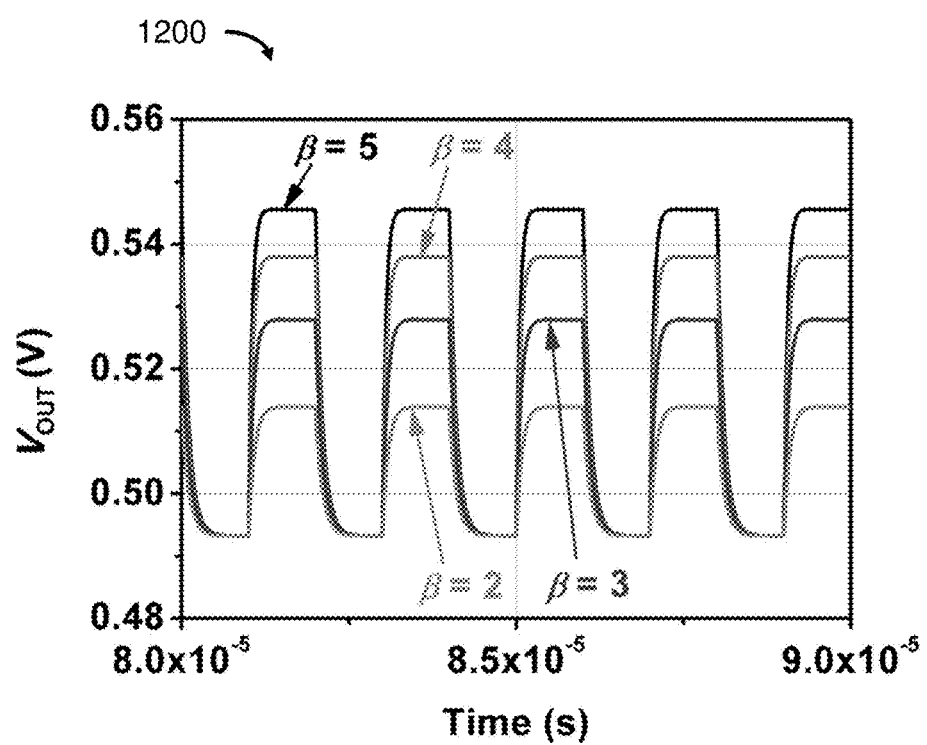
FIG. 12 shows SPICE simulation results of an improved D-LDO with $\beta$ value ranges from 2 to 5, 1 MHz sampling frequency, 1 mA load current, $V_{IN}$=0.6 V and $V_{REF}$=0.5 V in accordance with an example embodiment.

Based on FIG. 11, mode-1 LCO would also steadily exist when $\beta>2$ in one example embodiment. As the oscillation amplitude of Sum(t) is equal to ($\beta-1$) unit, the LCO amplitude increases with $\beta$. This is verified by SPICE simulation results of an improved D-LDO in one example embodiment illustrated in FIG. 12, where transient waveforms of $V_{OUT}$ are plotted with $\beta$ ranging from 2 to 5, with 1 MHz sampling frequency, 1 mA load current, $V_{IN}=0.6V$ and $V_{REF}=0.5$ V. In addition, based on FIG. 12, it is shown that the DC value of $V_{OUT}$ would deviate more from $V_{REF}$ with larger $\beta$. Thus, $\beta>2$ is not preferred.

Figure 13:
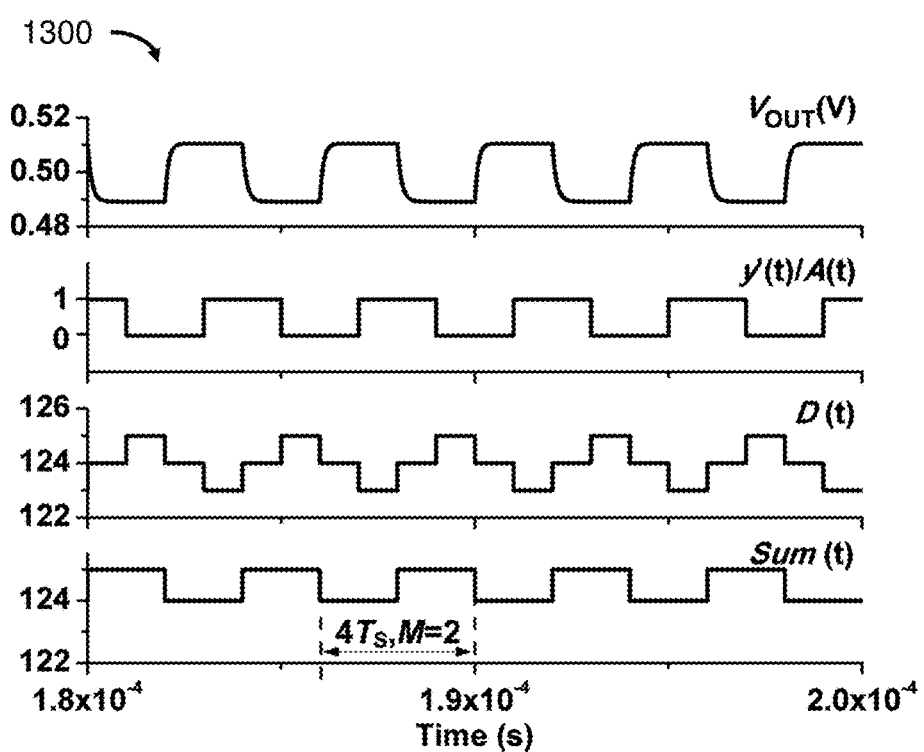
FIG. 13 shows SPICE simulation results of an improved D-LDO in $\beta$=1 case, with 1 MHz $F_S$ and 1 mA load current in accordance with an example embodiment.

For $\beta=1$, a mode-2, rather than mode-1 LCO, is observed in both calculation and simulation. SPICE simulated steady-state waveforms of an improved D-LDO in one example embodiment with $\beta=1$, 1 MHz $F_S$ and 1 mA load current are shown in FIG. 13. A mode-2 LCO, with Sum(t) oscillation amplitude equal to 1, can be steadily obtained with the combined D(t) and A(t). Consequently, with $\beta=1$, a comparable LCO amplitude but with two times of the period is observed when compared with the $\beta=2$ case, as long as $F_S$ is below the output pole frequency. However, for $F_S$ higher than the output pole frequency, the $C_L$ is not sufficiently charged or discharged in one clock period, and the longer LCO period incited by $\beta=1$ is resulted in a larger LCO amplitude.

Figure 14:
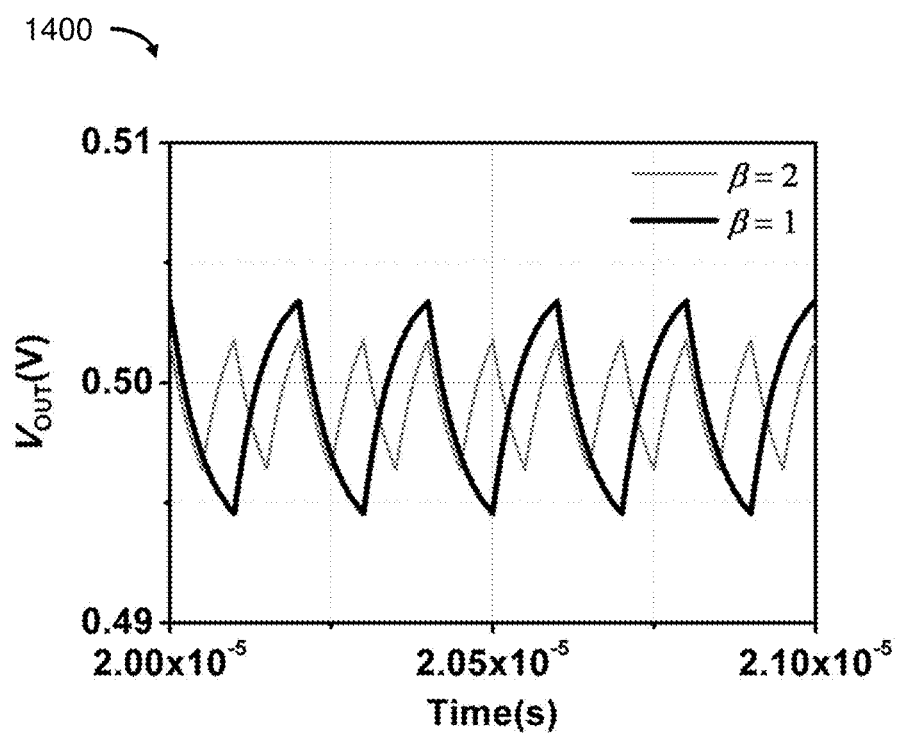
FIG. 14 shows SPICE simulated $V_{OUT}$ waveforms for $\beta$=1 and 2 cases, with 20 MHz $F_S$ and 1 mA load current in accordance with an example embodiment.

FIG. 14 shows the simulated $V_{OUT}$ waveforms for $\beta=1$ and 2 cases, with $F_S=20$ MHz and load current=1 mA in one example embodiment. By comparison, an approximately 50% reduction in LCO amplitude is achieved with $\beta=2$.

For a theoretical analysis, the phase shift caused by S'(z) can be calculated as:

$$\theta_{S'} = -\tan^{-1} \frac{\cos\frac{\pi}{2M}}{(\beta-1)\sin\frac{\pi}{2M}}. \quad (10)$$

For $\beta \geq 2$ and M=1, $\theta_{S'}$ adds an additional phase shift of $\pi$ when comparing to $\theta_S$ in Table 800 of FIG. 8, which makes M=1 a solution of (7). Meanwhile, M>1 is less likely to meet (7) because the $\tau/T_S$ term can be estimated to be much smaller than 1 at low $F_S$. This corroborates the mode-1 LCO existence for $\beta \geq 2$, which can be further verified by the numerical calculation given in FIG. 7B and SPICE simulation shown in FIG. 12.

For $\beta=1$, $\theta_S$ is a constant equal to $-\pi/2$ according to (10), regardless the value of M. Therefore, (7) can be rewritten as:

$$\varphi_{LCO} = \frac{\pi}{2} - \tan^{-1}\frac{\pi}{M}\frac{\tau}{T_S}, \varphi_{LCO} \in \left(0, \frac{\pi}{M}\right). \quad (9)$$

Based on the above discussion on $\tau/T_S$, only mode-1 and mode-2 can possibly be achieved for (11). However, Sum(t) becomes 0 in mode-1 as shown in FIG. 11, indicating that a stable oscillation cannot be built up, and thus only mode-2 is achievable in this case.

To sum up, $\beta=2$ is selected based on two considerations. First, it outweighs the $\beta>2$ cases by achieving lower LCO amplitudes and DC derivations. Second, when comparing to the $\beta=1$ case, it shortens the LCO period and thereby reduces the LCO amplitude as well.

Figure 15A:
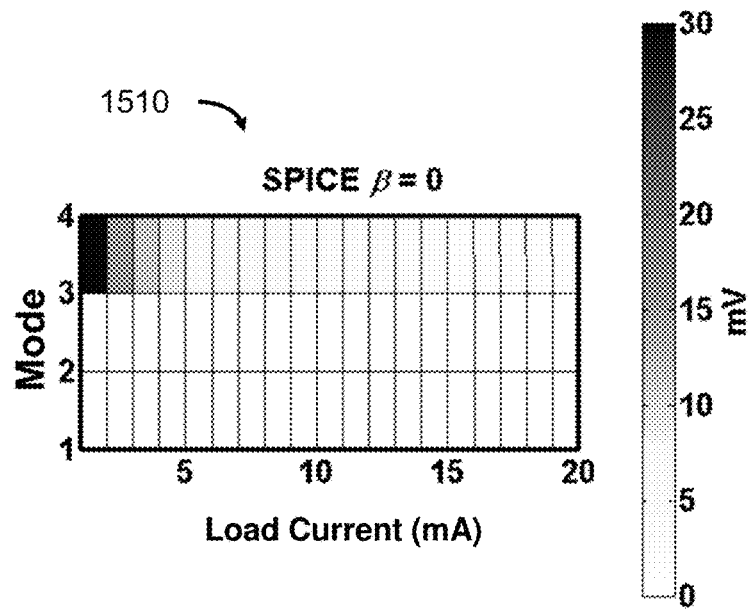
FIG. 15A shows simulated LCO modes and amplitudes with load current ranges from 1 to 20 mA in $\beta$=1 case in accordance with an example embodiment.
Figure 15B:
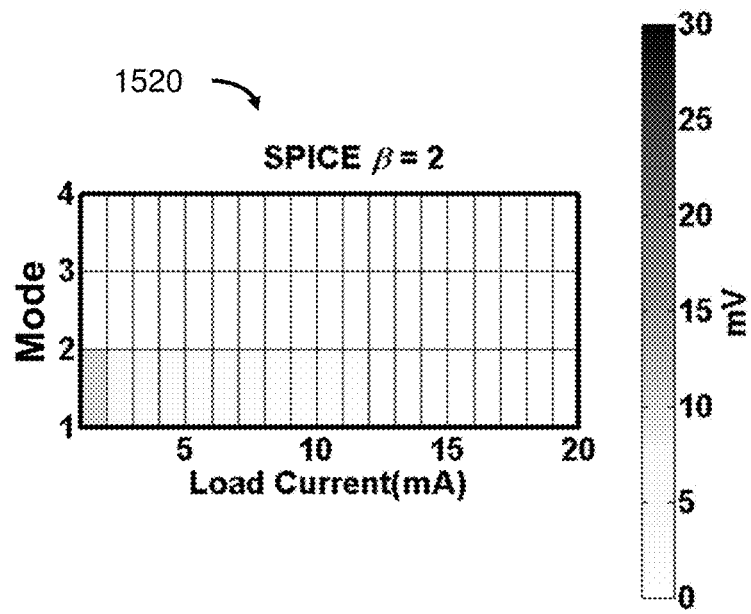
FIG. 15B shows simulated LCO modes and amplitudes with load current ranges from 1 to 20 mA in $\beta$=2 case in accordance with an example embodiment.
Figure 16A:
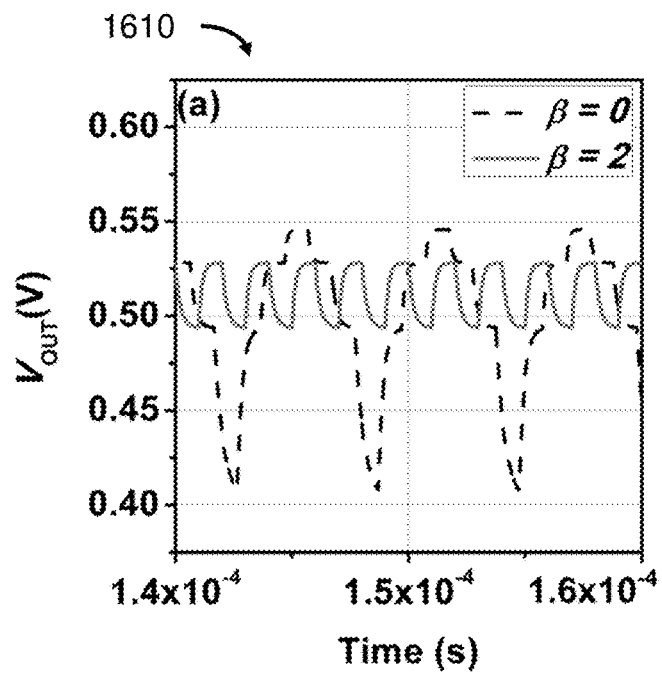
FIG. 16A shows simulated results of an improved D-LDO in $\beta$=1 and 2 cases, with 0.5 mA load current, at $F_S$=1 MHz and $V_{REF}$=0.5 V in accordance with an example embodiment.
Figure 16B:
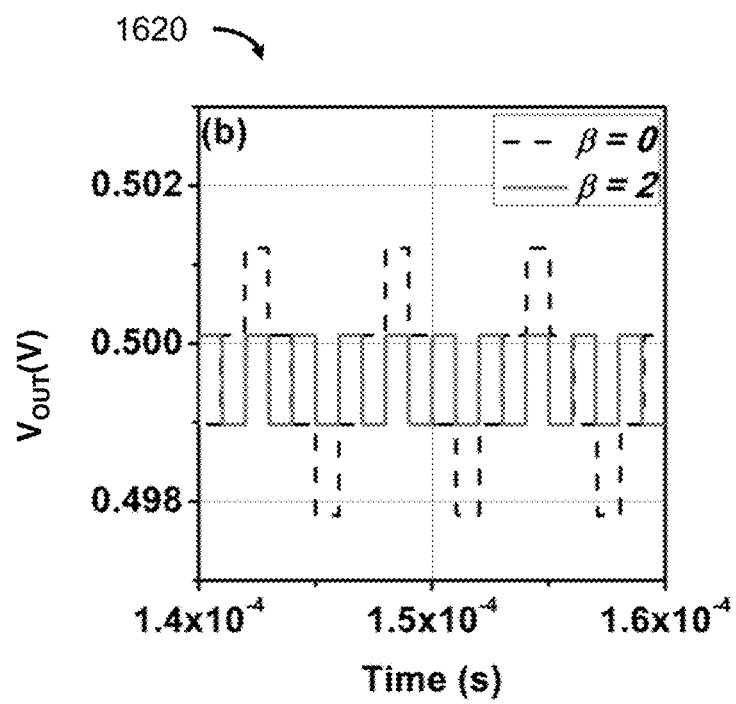
FIG. 16B shows simulated results of an improved D-LDO in $\beta$=1 and 2 cases, with 20 mA load current, at $F_S$=1 MHz and $V_{REF}$=0.5 V in accordance with an example embodiment.

To further substantiate the method that reduces LCO amplitude of a D-LDO in one example embodiment, the simulated LCO modes and amplitudes with load current from 1 to 20 mA with $\beta=0$ and $\beta=2$ are plotted in FIGS. 15A and 15B respectively. Comparing to FIGS. 7A and 7B, the simulated cases coincide well with the calculated cases. Moreover, the simulated transient waveforms of $V_{OUT}$ for both $\beta=0$ and $\beta=2$ cases with load current of 0.5 mA and 20 mA in one example embodiment are shown in FIGS. 16A and 16B respectively. All these results are simulated with $F_S=1$ MHz, $V_{IN}=0.6$ V and $V_{REF}=0.5$ V. Because of the LCO mode reduction from 3 to 1 with the method in one example embodiment, the LCO amplitudes are reduced to at least ⅓ of the original values. In particular, for the light load case of 0.5 mA, the LCO amplitude is reduced from 140 mV to 30 mV peak-to-peak.

Figure 17A:
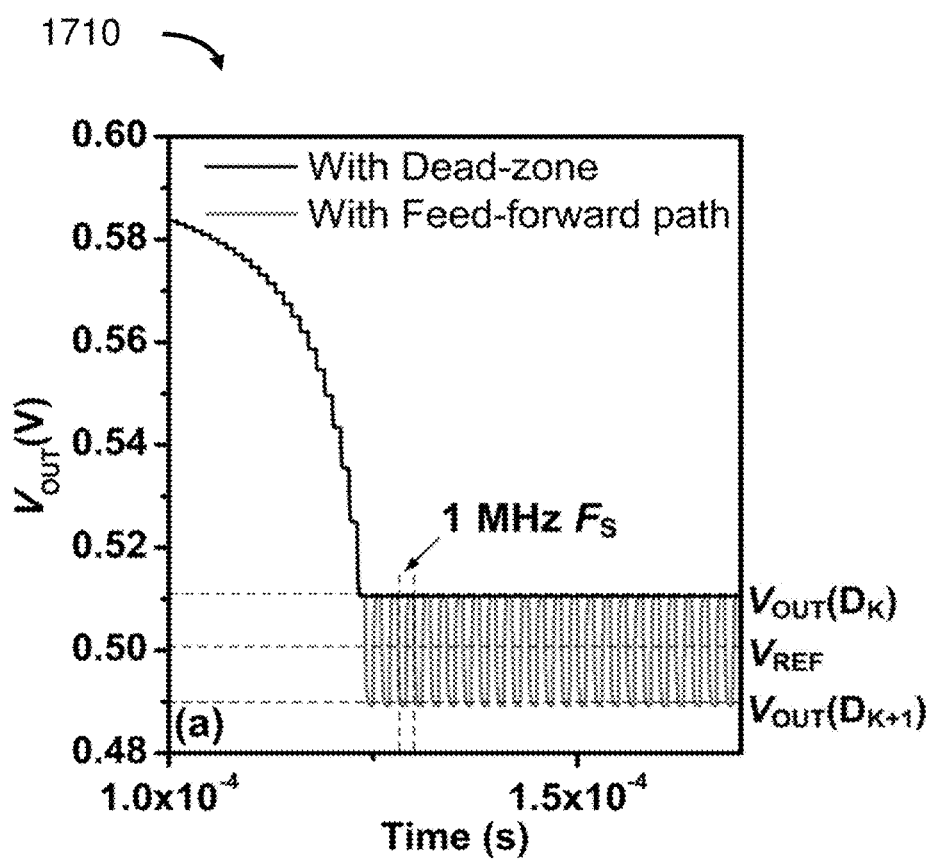
FIG. 17A shows simulated $V_{OUT}$ waveforms of the D-LDOs under $V_{IN}$=0.6 V, $V_{REF}$=0.5 V, $I_{LOAD}$=1 mA, $F_S$=1 MHz for the dead-zone scheme with ±20 mV and for the method in accordance with an example embodiment with $\beta 3$=2.
Figure 17B:
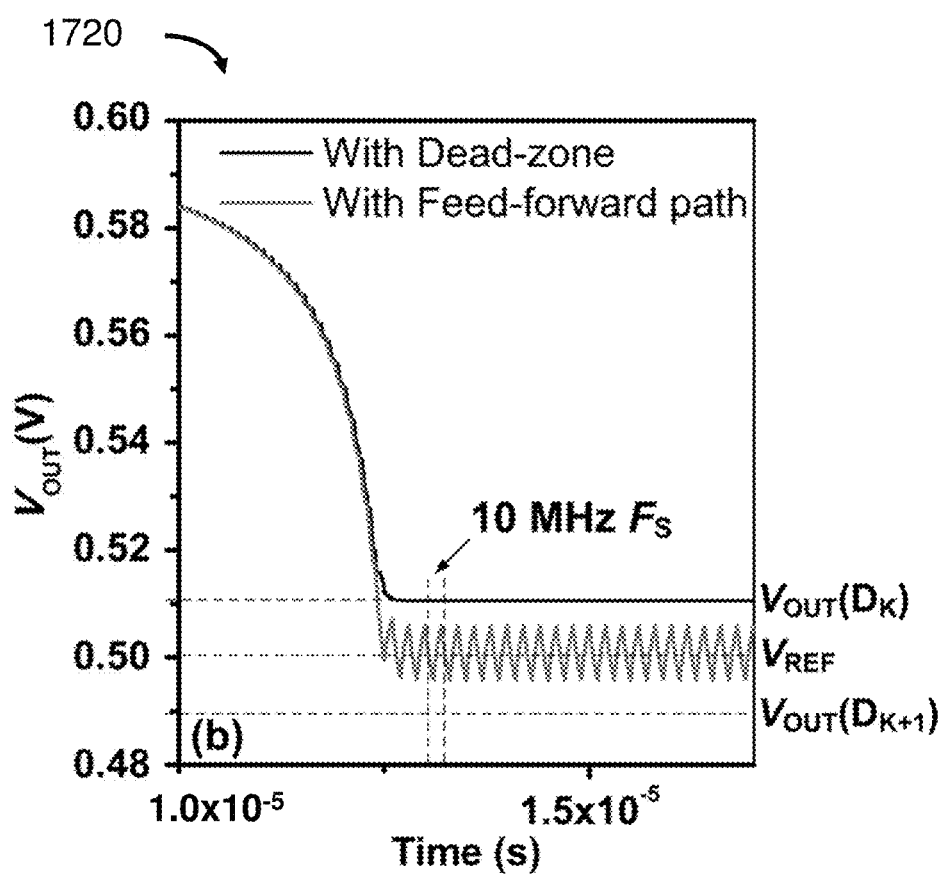
FIG. 17B shows simulated $V_{OUT}$ waveforms of the D-LDOs under $V_{IN}$=0.6 V, $V_{REF}$=0.5 V, $I_{LOAD}$=1 mA, $F_S$=10 MHz for the dead-zone scheme with ±20 mV and for the method in accordance with an example embodiment with $\beta$=2.

A dead-zone scheme helps to eliminate LCO in a D-LDO. However, the resultant output steady-state DC error is no smaller than the LCO amplitude with the method in an example embodiment. Let the two consecutive control words that make $V_{OUT}$ closest to $V_{REF}$ be $D_K$ and $D_{K+1}$. With the dead-zone operation, the D-LDO stabilizes to their corresponding output voltages $V_{OUT}(D_K)$ or $V_{OUT}(D_{K+1})$, depending on the initial condition. For the method in one example embodiment, once the LCO mode is set to 1, the digital control word only oscillates between $D_K$ and $D_{K+1}$. Thus, in the $C_L$ sufficiently charged/discharged scenario, both output errors are either $|V_{OUT}(D_{K+1})-V_{REF}|$ or $|V_{OUT}(D_K)-V_{REF}|$. However, for a higher $F_S$ and an insufficient $C_L$ charging/discharging time, the error of the method in one example embodiment is smaller. FIGS. 17A and 17B show the simulated $V_{OUT}$ waveforms of the D-LDOs under $V_{IN}$=0.6 V, $V_{REF}$=0.5 V, $I_{LOAD}$=1 mA for the dead-zone scheme with ±20 mV and for the method in one example embodiment with β=2, with $F_S$ equals to 1 MHz and 10 MHz respectively. The output error in one example embodiment is significantly reduced with the increase of $F_S$.

As used herein, a "power transistor array" or a "power MOS array" or "PMOS" is a set of power transistors.

As used herein, a "steady state" is an equilibrium condition of a circuit that occurs as the effects of transients are no longer important.

As used herein, an "ADC" or an "analog-to-digital converter" is a system that converts an analog signal into a digital signal.

As used herein, a "shift register" is a cascade of flip flops, sharing the same clock, in which the output of each flip-flop is connected to the data input of the next flip-flop in the chain, resulting in a circuit that shifts by one position the bit array stored in it, shifting in the data present at its input and shifting out the last bit in the array, at each transition of the clock input. A "bi-directional shift register" allows shifting in both directions and a "serial in parallel out" bi-directional shift register converts the data from a serial data input signal to a parallel data output.

As used herein, a "control word" has a unique and positive meaning which causes the electronics to execute a particular function.

As used herein, a "zero order hold" is a block that models the conversion of digital samples to continuous-time.

The systems and methods in accordance with example embodiments are provided as examples, and examples from one system or method should not be construed to limit examples from another system or method. Further, methods discussed within different figures can be added to or exchanged with methods in other figures. Further yet, specific numerical data values (such as specific quantities, numbers, categories, etc.) or other specific information should be interpreted as illustrative for discussing example embodiments. Such specific information is not provided to limit example embodiments.

What is claimed is:

1. A method that reduces a limit cycle oscillation (LCO) amplitude of a digital low dropout regulator (D-LDO), the method comprising:
   sensing a difference between an output voltage ($V_{OUT}$) and a reference voltage ($V_{REF}$) at an input of a comparator;
   transmitting an output of the comparator to a serial-in parallel-out bi-directional shift register that includes a delay unit of one clock period ($z^{-1}$);
   applying an output (D(t)) of the serial-in parallel-out bi-directional shift register to control a number of power transistors in a main power transistor array (Main PMOS) to be turned on;
   placing a load capacitor at a node at ($V_{OUT}$); and
   reducing, by the output of the comparator, the LCO amplitude of the D-LDO by driving an auxiliary power transistor array (Aux PMOS) in parallel with the Main PMOS,
   wherein the comparator and the serial-in parallel-out bi-directional shift register are both operating at a sampling frequency ($F_S$), the Aux PMOS has an identical unit size with the Main PMOS, the Aux PMOS is (β)-unit in strength, and (β) is selected to achieve a minimum LCO mode and a minimum LCO amplitude, wherein (β) is a number of a unit size.

2. The method of claim 1 further comprising:
setting the sampling frequency ($F_S$) to 1 MHz.

3. The method of claim 1 further comprising:
modeling a conversion of digital samples to continuous-time by a zero order hold.

4. The method of claim 1 further comprising:
calculating a summed control word (Sum(t)) that sums the output (D(t)) and a control word of the Aux PMOS (A(t)), wherein the summed control word (Sum(t)) is represented by:

Sum(t)=D(t)+A(t).

5. The method of claim 1 further comprising:
setting (β) to 2 and the minimum LCO mode to 1.

6. The method of claim 1 further comprising:
calculating a transfer function (S'(z)) of the serial-in parallel-out bi-directional shift register plus a feed-forward path for determining the minimum LCO mode and the minimum LCO amplitude, wherein z is a frequency variable and the transfer function (S'(z)) is represented as $$S'(z) = \frac{1}{z-1} + \frac{\beta}{2}.$$

7. An improved digital low dropout regulator (D-LDO) with reduction of limit cycle oscillation (LCO) amplitude, comprising:
   a comparator that senses a difference between an output voltage ($V_{OUT}$) and a reference voltage ($V_{REF}$);
   a serial-in parallel-out bi-directional shift register that includes a delay unit of one clock period ($z^{-1}$), wherein an output of the comparator transmits to the serial-in parallel-out bi-directional shift register;
   a main power transistor array (Main PMOS), wherein an output (D(t)) of the serial-in parallel-out bi-directional shift register controls a number of power transistors in the Main PMOS to be turned on;
   a load capacitor at a node at ($V_{OUT}$); and
   a feed-forward path that reduces the LCO amplitude of the improved D-LDO and that includes an auxiliary power transistor array (Aux PMOS), wherein the Aux PMOS is driven by the output of the comparator in parallel with the Main PMOS,
   wherein the comparator and the serial-in parallel-out bi-directional shift register are both operating at a sampling frequency ($F_S$), the Aux PMOS has an identical unit size with the Main PMOS, the Aux PMOS is (β)-unit in strength, and (β) is selected to achieve a minimum LCO mode and a minimum LCO amplitude, wherein (β) is a number of a unit size.

8. The improved D-LDO of claim 7, wherein the sampling frequency ($F_S$) is 1 MHz.

9. The improved D-LDO of claim 7 further comprising a zero-order hold which models the conversion of digital samples to continuous-time.

10. The improved D-LDO of claim 7, wherein the LCO mode and the LCO amplitude is calculated by a transfer function (S'(z)) of the serial-in parallel-out bi-directional shift register plus the feed-forward path, wherein z is a frequency variable and the transfer function (S'(z)) is represented as $$S'(z) = \frac{1}{z-1} + \frac{\beta}{2}.$$

11. The improved D-LDO of claim 7, wherein the D-LDO calculates a summed control word (Sum(t)) that sums the output (D(t)) and a control word of Aux PMOS (A(t)) and is represented by:

Sum(t)=D(t)+A(t).

12. The improved D-LDO of claim 7, wherein (β) is selected to 2 and the mode of LCO is set to 1.

13. The improved D-LDO of claim 7, wherein the Aux PMOS is consisted of two auxiliary unit power transistors.

14. A method that improves circuit complexity in implementing a digital low dropout regulator (D-LDO) with reduced limit cycle oscillation (LCO), the method comprising:
sensing a difference between an output voltage ($V_{OUT}$) and a reference voltage ($V_{REF}$) at an input of a comparator;
feeding an output of the comparator to a serial-in parallel-out bi-directional shift register, wherein the serial-in parallel-out bi-directional shift register includes a delay unit of one clock period ($z^{-1}$);
applying an output (D(t)) of the serial-in parallel-out bi-directional shift register to control a number of power transistors in a main power transistor array (Main PMOS) to be turned on;
placing a load capacitor at a node at ($V_{OUT}$); and
improving circuit complexity in implementing the D-LDO with reduced LCO by adding an auxiliary power transistor array (Aux PMOS) in parallel with the Main PMOS as a feed-forward path, wherein the output of the comparator drives the Aux PMOS, the comparator and the serial-in parallel-out bi-directional shift register are both operating at a sampling frequency ($F_S$), the Aux PMOS has an identical unit size with the Main PMOS, the Aux PMOS is (β)-unit in strength, and (β) is selected to achieve a minimum LCO mode and a minimum LCO amplitude, wherein (β) is a number of a unit size.

15. The method of claim 14 further comprising:
setting the sampling frequency ($F_S$) to 1 MHz.

16. The method of claim 14 further comprising:
calculating a summed control word (Sum(t)) that sums the output (D(t)) and a control word of the Aux PMOS (A(t)), wherein the summed control word (Sum(t)) is represented by:

Sum(t)=D(t)+A(t).

17. The method of claim 14 further comprising:
setting (β) to 2 and the LCO mode to 1.

18. The method of claim 14 further comprising:
calculating a transfer function (S'(z)) of the serial-in parallel-out bi-directional shift register plus the feed-forward path for determining the minimum LCO mode and the minimum LCO amplitude, wherein z is a frequency variable and the transfer function (S'(z)) is represented as $$S'(z) = \frac{1}{z-1} + \frac{\beta}{2}.$$

19. The method of claim 14, wherein the Aux PMOS is consisted of two auxiliary unit power transistors.

* * * * *